US008053352B2

(12) United States Patent
Booth, Jr. et al.

(10) Patent No.: US 8,053,352 B2
(45) Date of Patent: Nov. 8, 2011

(54) METHOD AND MESH REFERENCE STRUCTURES FOR IMPLEMENTING Z-AXIS CROSS-TALK REDUCTION THROUGH COPPER SPUTTERING ONTO MESH REFERENCE PLANES

(75) Inventors: Roger Allen Booth, Jr., Rochester, MN (US); Matthew Stephen Doyle, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 1115 days.

(21) Appl. No.: 11/250,043

(22) Filed: Oct. 13, 2005

(65) Prior Publication Data

US 2007/0087556 A1   Apr. 19, 2007

(51) Int. Cl.
*H01L 21/4763* (2006.01)

(52) U.S. Cl. ........ 438/622; 438/128; 438/584; 438/598; 438/652; 257/E23.141; 257/E23.151; 257/E23.17; 257/E21.575; 257/E21.627

(58) Field of Classification Search .................. 438/128, 438/129, 584, 598, 599, 618, 622, 625, 652; 257/E23.141, E23.142, E23.143, E23.145, 257/E23.151, E23.168, E23.17, E23.175, 257/E21.575, E21.627
See application file for complete search history.

(56) References Cited

U.S. PATENT DOCUMENTS

| 5,296,651 | A   |   | 3/1994 | Gurrie et al. |         |
|-----------|-----|---|--------|---------------|---------|
| 5,334,800 | A   |   | 8/1994 | Kenney        |         |
| 6,432,813 | B1  | * | 8/2002 | Sandhu et al. | 438/622 |
| 6,599,828 | B1  | * | 7/2003 | Gardner       | 438/632 |
| 2002/0163029 | A1 | * | 11/2002 | Dirnecker et al. | 257/306 |
| 2006/0131700 | A1 | * | 6/2006 | David et al. | 257/632 |

OTHER PUBLICATIONS

General definition of sputtering process by www.wikipedia.com; search word sputtering process.*

* cited by examiner

*Primary Examiner* — Matthew Smith
*Assistant Examiner* — Su Kim
(74) *Attorney, Agent, or Firm* — Joan Pennington

(57) ABSTRACT

A method and mesh reference applications are provided for implementing Z-axis cross-talk reduction. A mesh reference plane including a grid of mesh traces is formed with the mesh traces having selected thickness and width dimensions effective for reference current-flow distribution. An electrically conductive coating is deposited to fill the mesh electrical holes in the mesh reference plane to reduce cross-talk, substantially without affecting mechanical flexibility.

4 Claims, 4 Drawing Sheets

US 8,053,352 B2

METHOD AND MESH REFERENCE STRUCTURES FOR IMPLEMENTING Z-AXIS CROSS-TALK REDUCTION THROUGH COPPER SPUTTERING ONTO MESH REFERENCE PLANES

FIELD OF THE INVENTION

The present invention relates generally to the data processing field, and more particularly, relates to a method and mesh reference structures for implementing Z-axis cross-talk reduction through the application of a sputtered copper coating applied to a mesh reference plane.

DESCRIPTION OF THE RELATED ART

Both first-level packaging and flexible circuit technology often utilize cross-hatched or mesh copper ground and power reference planes for reference current-flow distribution and to provide mechanical flexibility.

For example, U.S. Pat. No. 5,334,800 issued Aug. 2, 1994 shows one example of making a flexible circuit with a mesh ground plane. The flexible, shielded circuit board includes a number of electrical conductors disposed in a substrate, substantially parallel to opposing surfaces of the substrate. Electrical shield layers in the form of a mesh or grid are disposed on the substrate surfaces and are preferably formed by screen-printing a conductive layer on each side of the substrate. A repeating pattern of shield conductors, shield conductor vertices, and voids in the shield layer through which the substrate is exposed is thus created on either side of the substrate.

While there are advantages to both first-level packages and flexible circuits when utilizing mesh planes, these first-level packages and flexible circuits suffer from Z-axis cross-talk as a result. Simply stated, the holes in the reference layers allow Z-axis cross-talk or signal energy to couple between layers.

U.S. Pat. No. 5,296,651 discloses a flexible circuit suitable for high-density applications and having a long flexural life. A thin film metallic ground plane electrically shields the conductor traces in the flexible circuit and attempts to reduce in-plane cross-talk between conductor traces without reducing the flexibility or the flexural life of the flexible circuit. The ground plane deposited on a dielectric substrate includes a pattern of holes formed in ground plane for adding flexibility, while also allowing Z-axis cross-talk.

FIG. 1 illustrates Z-axis cross-talk results for a pair of 10 inch long signal line length, multi-layer test circuits. Two test circuits utilizing two wiring planes were constructed, one with a 9/13 mesh reference shield dimension and one with a 6/15 mesh reference shield dimension. Core thickness and line widths were designed for 50-ohm characteristic impedances on both signal layers. These test circuits were energized using a square-wave signal generator at frequencies varying between 0.1 and 2.5 GHz. Energy coupled from an aggressor line on signal layer 1 to a victim line on signal layer 2 was measured at each test frequency.

As shown in FIG. 1, the measured results indicate that mesh reference shield dimensions and the switching frequency significantly affect the total coupled noise from one signal layer to another. This detrimental coupled noise can prohibit noise budgets from being met. However, removal of the mesh reference plane can prohibit mechanical flexibility requirements from being met.

FIG. 2 illustrates a conventional mesh reference circuit application 200 utilizing a mesh reference shield and including a plurality of mesh power and ground (PWR/GND) reference planes 202 with grid of mesh lines or traces 204 and a plurality of signal planes 208 with signal lines 210. A respective dielectric layer 212 is provided above the signal layers 208. As can be seen in FIG. 2, the two signal lines 210 have a short line-of-sight path between them, and this means that the two signal lines 210 can be quite strongly coupled electrically. As a result, cross-talk can be a significant concern.

A need exists for an effective mechanism to significantly reduce Z-axis cross-talk in the first-level package and flexible circuit applications.

SUMMARY OF THE INVENTION

Principal aspects of the present invention are to provide a method and mesh reference structures for implementing Z-axis cross-talk reduction. Other important aspects of the present invention are to provide such method and mesh reference applications for implementing Z-axis cross-talk reduction substantially without negative effect and that overcome many of the disadvantages of prior art arrangements.

In brief, a method and mesh reference structures are provided for implementing Z-axis cross-talk reduction. A mesh reference plane including a grid of mesh traces is formed with the mesh traces having selected thickness and width dimensions effective for reference current-flow distribution. An electrically conductive coating is deposited to fill the mesh electrical holes in the mesh reference plane to reduce cross-talk, substantially without affecting mechanical flexibility.

In accordance with features of the invention, the electrically conductive coating is deposited using a sputtering process, such as a vacuum sputtering deposition process. The electrically conductive coating is formed, for example, of a copper thin film. The electrically conductive coating has a thickness of about one micrometer ($10^{-6}$ meter). The thickness of the electrically conductive coating is substantially less than the thickness of the mesh traces of the mesh reference plane, for example, about 1/25 of the thickness of the mesh traces.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the preferred embodiments, a method for forming mesh reference applications allows continued use of a mesh reference plane while eliminating or significantly reducing z-axis coupled noise. Existing vacuum sputtering deposition processes are used to coat a mesh reference plane with thin, for example on the order of one micrometer (1 μm) film of copper in order to significantly reduce or eliminate Z-axis cross-talk without detrimentally affecting mechanical flexibility of the circuit. This is extremely advantageous for designs, which require mesh copper planes to meet mechanical flexibility requirements but cannot tolerate the increased Z-axis cross-talk associated with reference planes with mesh openings or holes in the mesh reference planes.

Figure 1:
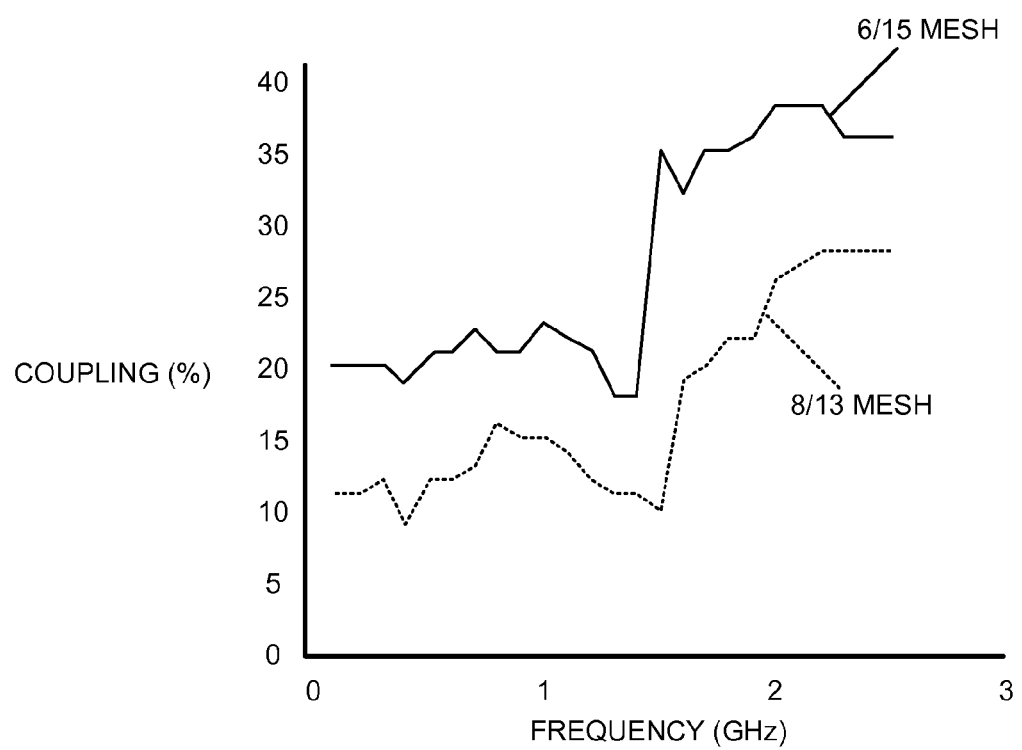
FIG. 1 is a chart illustrating test results with Z-axis coupling percentage along the vertical axis with respect to signal frequency in GHz along the horizontal axis for two test mesh reference circuits each including two signal wiring planes and mesh reference planes, one test circuit with a 9/13 mesh reference shield dimension and one test circuit with a 6/15 mesh reference shield dimension.
Figure 2:
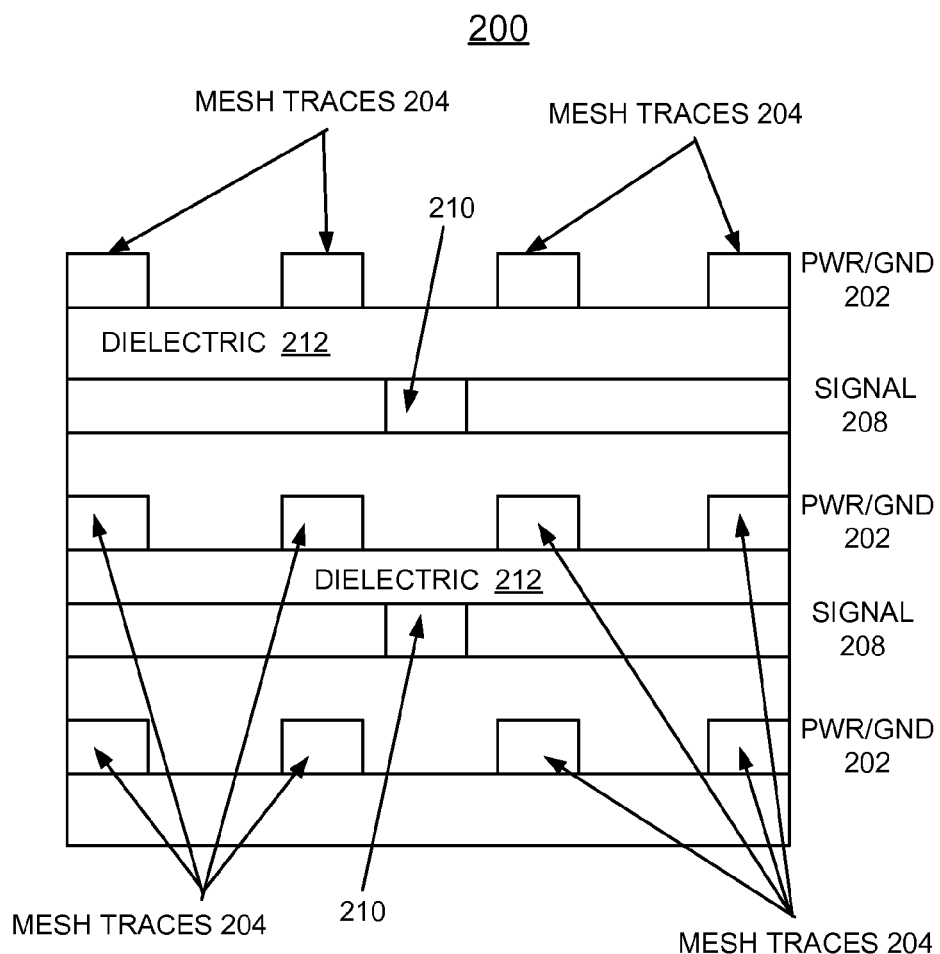
FIG. 2 illustrates a prior art mesh reference application including two signal wiring planes together with multiple mesh ground and power reference planes.
Figure 3:
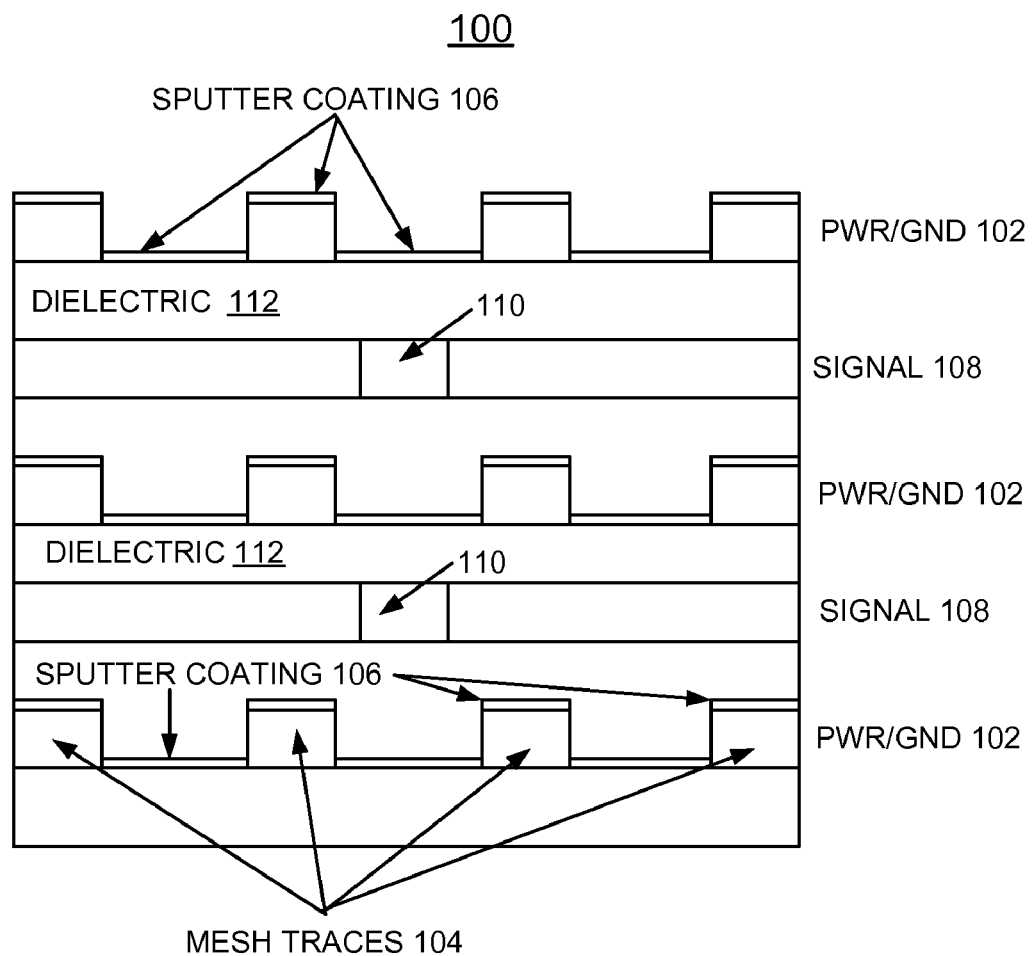
FIG. 3 is a side view illustrating an exemplary mesh reference application in accordance with the preferred embodiment.

Having reference now to the drawings, in FIG. 3, there is shown an exemplary mesh reference application generally designated by the reference character 100 in accordance with the preferred embodiment. Mesh reference application 100 includes a plurality of mesh power and ground (PWR/GND) reference planes 102 with grid of mesh lines or traces 104. Mesh reference application 100 includes a sputter coating 106, for example of copper, that is applied over the entire surface of the mesh PWR/GND reference planes 102. The sputter coating 106 is provided to fill the mesh electrical holes in the mesh PWR/GND reference planes with a small amount of copper to reduce or eliminate cross-talk, substantially without affecting mechanical flexibility.

In accordance with features of the preferred embodiments, the sputter coating 106 has a thickness of about 1 micrometer or micron, which is substantially less, for example approximately ⅟₂₅th of a typical thickness of mesh trace 104. The sputter coating 106 reduces or eliminates Z-axis cross-talk, while the grid of mesh lines or traces 104 are effective for reference current-flow distribution.

Mesh reference application 100 includes a plurality of signal planes 108, each including at least one signal trace 110. A respective dielectric layer 112 is provided above the signal layers 108. As shown in FIG. 3, the sputter coating 106 or thin copper film 106 eliminates the line-of-sight path between signal traces 110.

Figure 4A:
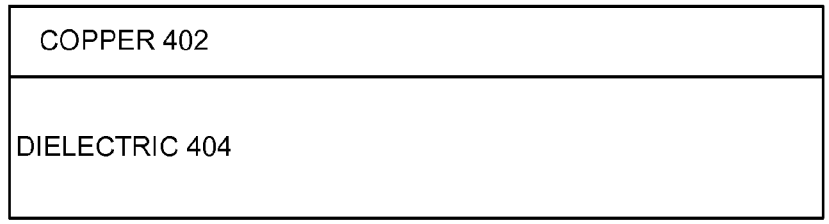
FIGS. 4A, 4B, and 4C are side views not to scale illustrating exemplary steps of a method for forming a mesh reference application in accordance with the preferred embodiment.
Figure 4B:
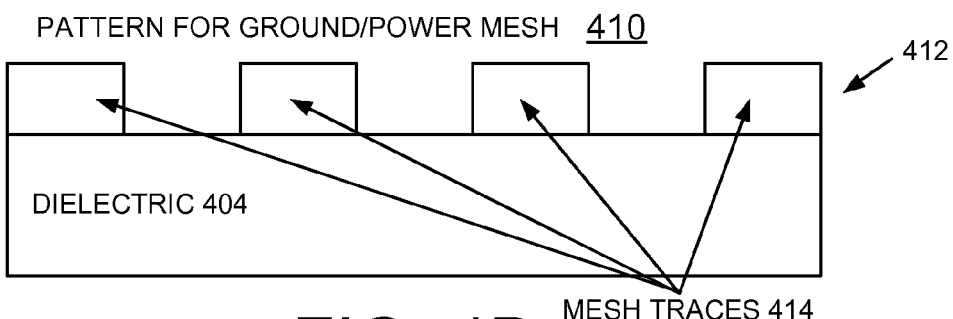
Figure 4C:
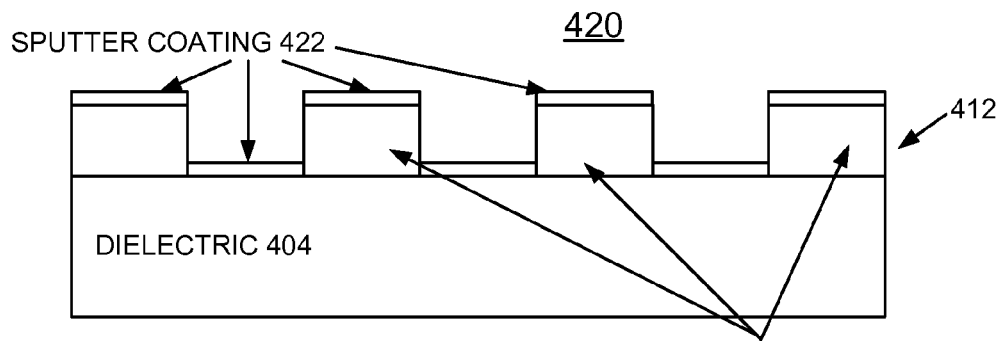

Referring to FIGS. 4A, 4B, and 4C, there are shown exemplary steps of a method for forming a mesh reference application including the sub-layers 102, 106 in accordance with the preferred embodiment.

Referring to FIG. 4A, an initial step generally designated by the reference character 400 of the fabrication sequence is shown. The process begins with a copper sheet 402 carried by a dielectric layer 404. The thickness of the copper sheet 402 typically has a thickness in a range between about 0.6-1.2 mils or 0.6-1.2 $10^{-3}$ inches.

Referring to FIG. 4B, a next step generally designated by the reference character 410 to pattern a mesh PWR/GND reference plane from the copper layer 402 of the fabrication sequence is shown. A mesh PWR/GND reference plane 412 is patterned to define a grid of mesh lines or traces 414 having a width typically on the order of 3-5 mils or 3-5 $10^{-3}$ inches, or other selected thickness and width dimensions effective for reference current-flow distribution.

Referring to FIG. 4C, a next step generally designated by the reference character 420 to sputter coat a very thin copper layer or sputter coating 422 over an entire mesh surface of the mesh PWR/GND reference plane 412 of the fabrication sequence is shown. The sputter coating 422 is formed, for example using conventional vacuum sputtering technology. The sputter coating 422 has a thickness of around 1 micrometer of copper. At this point, patterning of anti-pads and/or plane splits can be performed. Then other various sub-layers are then laminated together to form a selected multi-layer flex circuit, such as the mesh reference application structure 100.

Application of the mesh-reference plane sputter coating 422 can significantly reduce Z-axis cross-talk, as much as 95%, based upon 2-D field solutions.

While the present invention has been described with respect to a copper sputter coating for covering the mesh PWR/GND reference planes, it should be understood that the present invention is not limited to a copper sputter coating, various other electrically conductive materials could be used.

While the present invention has been described with reference to the details of the embodiments of the invention shown in the drawing, these details are not intended to limit the scope of the invention as claimed in the appended claims.

What is claimed is:

1. A method for forming a mesh reference structure comprising the steps of:
   forming a mesh power and ground reference plane including a grid of mesh traces;
   said mesh traces having selected thickness and width dimensions effective for reference current-flow distribution for associated signal traces; providing said mesh power and ground reference plane spaced apart from said associated signal traces; and
   depositing an electrically conductive coating selectively formed of a selected metal and having a selected thickness on said mesh power and ground reference plane to fill the mesh electrical holes in said mesh power and ground reference plane substantially without affecting mechanical flexibility of the mesh reference structure;
   said electrically conductive coating covering an entire mesh surface of said mesh power and ground reference plane and eliminating a line-of-sight path between associated signal traces and reducing cross-talk; and
   wherein depositing said electrically conductive coating includes depositing said electrically conductive coating having a thickness of about one micrometer ($10^{-6}$ meter).

2. A method for forming a mesh reference structure comprising the steps of:
   forming a mesh power and ground reference plane including a grid of mesh traces;
   said mesh traces having selected thickness and width dimensions effective for reference current-flow distribution for associated signal traces; providing said mesh power and ground reference plane spaced apart from said associated signal traces; and
   depositing an electrically conductive coating selectively formed of a selected metal and having a selected thickness on said mesh power and ground reference plane to fill the mesh electrical holes in said mesh power and ground reference plane substantially without affecting mechanical flexibility of the mesh reference structure;
   said electrically conductive coating covering an entire mesh surface of said mesh power and ground reference plane and eliminating a line-of-sight path between associated signal traces and reducing cross-talk; and,
   wherein depositing said electrically conductive coating includes depositing said electrically conductive coating having a predefined thickness of about ⅟₂₅ of a thickness of said mesh traces of said mesh power and ground reference plane.

3. A mesh reference structure comprising:
   a mesh power and ground reference plane including a grid of mesh traces;
   said mesh traces having selected thickness and width dimensions effective for reference current-flow distribution for associated signal traces;
   said mesh power and ground reference plane being spaced apart from said associated signal traces; and
   an electrically conductive coating selectively formed of a selected metal and having a selected thickness on said mesh power and ground reference plane substantially without affecting mechanical flexibility of the mesh reference structure, said electrically conductive coating filling mesh holes in said mesh power and ground reference plane covering an entire mesh surface of said mesh power and ground reference plane and eliminating a line-of-sight path between said associated signal traces and reducing cross-talk; and, wherein said electrically conductive coating has a thickness of about one micrometer ($10^{-6}$ meter).

4. A mesh reference structure comprising:

a mesh power and ground reference plane including a grid of mesh traces;

said mesh traces having selected thickness and width dimensions effective for reference current-flow distribution for associated signal traces;

said mesh power and ground reference plane being spaced apart from said associated signal traces; and an electrically conductive coating selectively formed of a selected metal and having a selected thickness on said mesh power and ground reference plane substantially without affecting mechanical flexibility of the mesh reference structure, said electrically conductive coating filling mesh holes in said mesh power and ground reference plane covering an entire mesh surface of said mesh power and ground reference plane and eliminating a line-of-sight path between said associated signal traces and reducing cross-talk; and, wherein said electrically conductive coating has a predefined thickness of about $\frac{1}{25}$ of a thickness of said mesh traces of said mesh power and ground reference plane.

* * * * *